Feb. 11, 1958

J. T. BECK 2,823,286

CONTACTS FOR ELECTRICAL CIRCUITS AND METHODS FOR MAKING SAME

Filed July 12, 1954

INVENTOR.
JOHN T. BECK
BY Paul, Moore & Dugger
ATTORNEYS 2,823,286
Patented Feb. 11, 1958

2,823,286

CONTACTS FOR ELECTRICAL CIRCUITS AND METHODS FOR MAKING SAME

John T. Beck, White Bear Lake, Minn.

Application July 12, 1954, Serial No. 442,802
9 Claims. (Cl. 200—166)

This invention relates to electrical circuit components and methods of making the same. More particularly, this invention relates to improvements in contacts for so-called "printed" electrical circuits and methods of making the same.

There have recently been developed so-called "printed" electrical circuits in which some or all of the components are composed of members that are "printed" on an insulating base either by adaptations of conventional printing methods, by stenciling, by spray milling techniques or the like. Circuits of this type offer advantages in that they are compact, light weight, easily duplicated and more economical than corresponding manually assembled circuits. However, in the past such circuit elements tended to be comparatively fragile and were not of high conductivity, as compared with electrically conductive metals per se, and the circuits did not readily adapt themselves to the attachment of external leads by soldering and the like because the circuit elements are thin and tend to "lift" when soldered.

For economic reasons, in the mass production of circuits, all of the individual circuit elements and the "printed" circuit component art first assembled and all of the connections involved are soldered in one operation by dipping. Obviously, this is impractical if the printed on circuit components will peel or dislodge from the underlying insulating surface, as frequently occurs in circuits made by prior methods.

Ordinary printed circuits were sensitive to the effects of humidity and weathering. Because the printed on components are very thin they were unsatisfactory for switch or commutator contacts, where a wiping action is encountered.

In my co-pending application, Ser. No. 138,246, for Electric Circuit Components and Methods of Preparing Same, filed January 12, 1950, and issued as Patent No. 2,683,839 on July 13, 1954, there is disclosed a method of making electric circuit components which obviate the above enumerated disadvantages of prior printed circuit components. The present invention is directed to the making of switch and commutator and like contacts involving a wiping action by a method incorporating certain of the steps of the above identified co-pending application. To this extent the present invention constitutes an improvement over the invention disclosed and claimed therein and the present application is a continuation-in-part of that application.

The principal object of this invention is to provide improved contacts for electrical circuit components.

Another object of this invention is to provide a method of making improved contacts for electrical circuit components.

It is another object of this invention to provide electrical circuit components having improved wiping action contacts.

Still another object of this invention is to provide a method of making electrical circuit components having improved wiping action contacts.

Other objects of the invention will become apparent as the description proceeds.

To the accomplishment of the foregoing and related ends, this invention then comprises the features hereinafter fully described and particularly pointed out in the claims, the following description setting forth in detail certain illustrative embodiments of the invention, these being indicative, however, of but a few of the various ways in which the principles of the invention may be employed.

The invention is illustrated by means of the drawings in which corresponding numerals refer to the same parts and in which.

Figure 1:
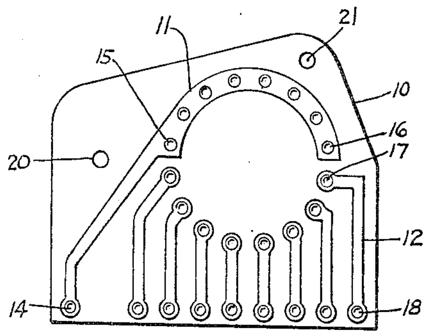
Figure 1 is a plan view of one face of an electrical circuit component according to this invention.
Figure 2:
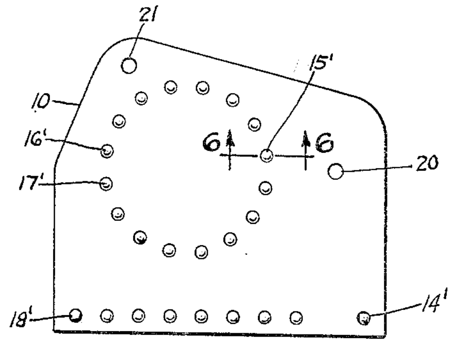
Figure 2 is a plan view of the other face of the circuit component shown in Figure 1.

Referring now to the drawings and particularly to Figures 1 and 2, there is shown here opposite faces of an electrical circuit component provided with improved contact-making means according to this invention. The circuit component comprises a base 10 formed of a hardened and cured thermosetting resinous layer or sheet. On one side thereof the base is provided with a plurality of circuit elements, such as for example, those elements indicated at 11 and 12. Each of the circuit elements is provided with one or more contact points such as are shown, for example, at 14, 15 and 16 on circuit elements 11, and 17 and 18 on circuit element 12. These contact points are formed so as to project through apertures in base 10 and emerge as contacts 14′, 15′, 16′, 17′ and 18′ respectively on the opposite face of the component.

Figures 3, 4, 6, 7:
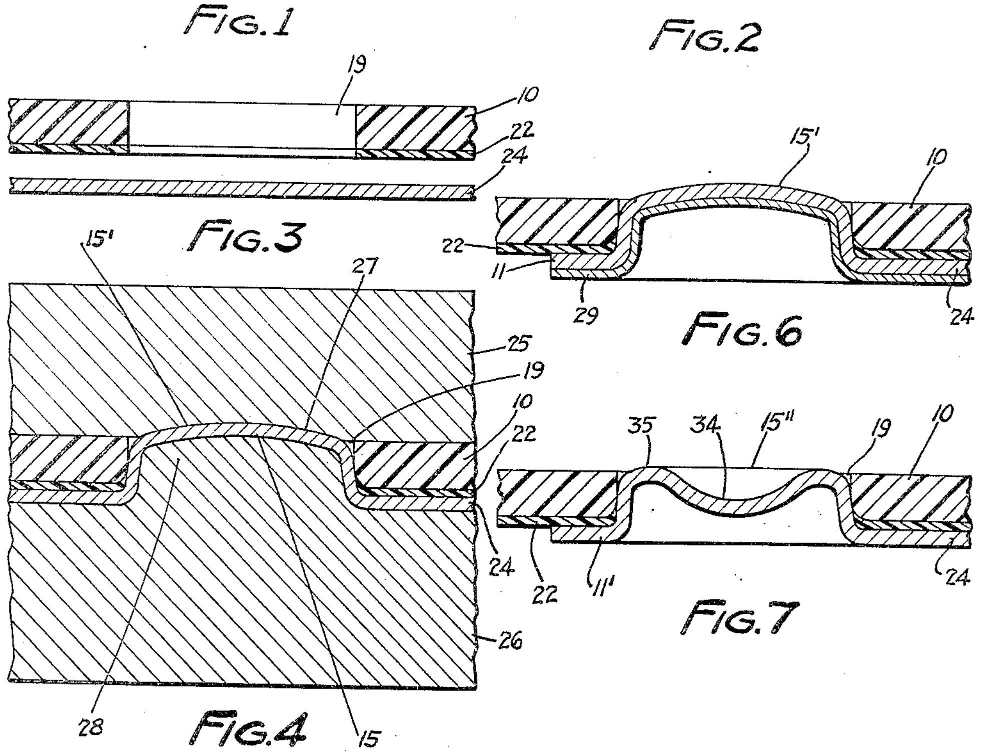
Figures 3 through 6 are enlarged vertical sections showing successive steps in the manufacture of the circuit component and taken along the line 6—6 and in the direction of the arrows of Figure 2.
Figure 7 is an enlarged vertical section showing an alternative form of contact construction.

The base plate 10 is preferably initially formed of a partially hardened thermosetting resinous insulating material such as, for example, the phenolics, urea-formaldehyde resins, melamines, furans, and the like. If desired, the resinous base may be reinforced by glass fibers or the like. For example, the base sheet may be formed by impregnating a sheet of woven "Fiberglas" fabric with a phenol-formaldehyde resin in the "A" stage and then allowing the resin impregnated sheet to partially harden. The insulating base is initially provided with a plurality of apertures 19 by punching or otherwise, positioned to coincide with the desired contact points in the finished component. At the same time or subsequently, the blank may be provided with indexing holes, as 20 and 21. As shown in Figure 3, the base sheet 10 is provided with a layer of adhesive material 22 by which a sheet or foil 24 of an electrically conductive metal is secured to the base. The metal may be copper, aluminum, silver, brass or the like. The adhesive layer 22 may be of any of those resins from which the base may be formed or may be any one of a large number of additional adhesive materials. Such adhesives also include, but are not limited to, the vinyl resins, polystyrenes, silicones, acrylics, cellulosics, and the like. The metal sheet is preferably initially firmly pressed upon the adhesive layer 22 on base 10 and the whole unit is subjected to heat only sufficient to partially cure the resinous adhesive so as to hold the sheets 10 and 24 firmly together during processing.

In the next step of the process, as shown in Figure 4, the composite formed of punched or drilled base sheet 10 having the metallic layer 24 adhesively attached thereto is placed in a press having opposed die faces 25 and 26. The female die member 25 is formed of steel or other hard non-resilient supporting metal and is provided with a plurality of depressions 27 in its face positioned to register with the apertures in base sheet 10 when suitably indexed, as by holes 20 and 21. The opposing male die member is likewise formed of steel or other hard non-resilient supporting metal and is provided with a plurality of projections 28 indexed to register with depressions 27. When pressure is applied to the composite sheet between the dies of the press, metal of sheet 24 is pressed into aperture 19 of the base sheet 10 and against the depression 27 in the face of the female die member 25, forming the depression or dimple 15 in the metal, or viewed from the other side, contact point 15' projecting slightly from the opposite face of the circuit component.

Alternatively, the male die press member may be formed of a layer of so-called "punching rubber." The heavy pressure applied by the press is sufficient to force the resilient surface of the rubber layer into the apertures 19 of the base sheet 10 "drawing" the metal layer 24 and forcing it against depression 27 in the opposing die face. By heating the die faces partial curing of the resinous insulating base 10 and the adhesive layer 22 may take place.

Figure 5:
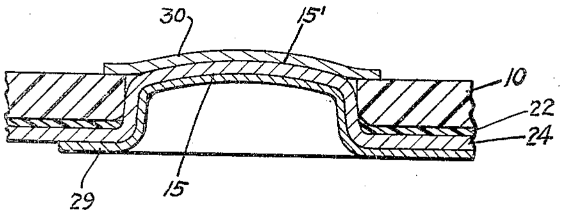

After the operation illustrated in Figure 4 is complete, there is applied to the metal surface 24 a coating 29 (Figure 5) of "stop-off" lacquer or paint, sometimes known as "resist" paint or enamel, suitable for protecting the metal from the erosive effects of an etching bath for the metal of which the conductive layer is formed. The resist material is applied in the depressions, such as 15, and on the exposed surface of metallic sheet 24 in the form of a design which outlines the circuit elements which are desired to be produced on the base sheet 10, such as, for example, as shown in Figure 1. The stop-off material should be applied not only over the area over the depressed portions of the metal sheet but also over areas contiguous thereto to provide anchoring flanges for the contacts and over areas to produce circuit elements or lines such as 11 and 12 connecting at least some of the contacts. The stop-off material should be of such consistency that the design or outline may be applied by rubbing through a silk screen or other stencil, printed, or otherwise applied to produce the outline of the circuit being manufactured. The stencil may conveniently be formed of a thin paramagnetic material and held in place by magnets. In general, any of the resinous materials useful in forming the adhesive layer 22 may be used to form the stop-off coating.

In producing some circuits, particularly where some of the elements and connecting circuit lines are of minute size, the stop-off enamel may be placed advantageously in the same manner as for the usual photo-engraving process using light sensitive enamels. In such a process the entire exposed metal surface of base sheet 10 is covered with a light sensitive enamel which is then exposed through a negative which permits light to fall on the enamel only in areas corresponding to those of the circuit lines and elements. The exposure to light sets the enamel in a hard, insoluble condition. The remaining enamel is soft and is washed away in developing. The hardened enamel thus placed then protects the underlying metal during subsequent etching.

The projecting faces 15' of the contact points are likewise protected from the effects of the etching bath, as by resist coating, a strippable masking tape 30 or the like. In producing some circuit components it may be desirable to alternate the resist applying step of Figure 5 and the pressing or stamping step of Figure 4.

After the resist coating has been "printed" on the metal surface of the component blank and the coating has been permitted to set, the surfaces of the component are exposed to the effects of a chemical or electrolytic etching bath. The etching bath is selected appropriately, as is well known in the etching and photo-engraving arts, for the type of metal comprising conductive layer 24. Thus, for example, where copper is used, the etching bath may consist of iron chloride and copper sulfate solution or acids, chlorides or the like, suitable for the removal of copper. Electrolytic etching baths for the metal or alloy composing the layer 24 are available and the techniques are well known.

The component is permitted to remain in the etching bath until the unprotected metal has been eaten away, as shown in Figure 6. The protective coating is removed from the exposed surface of the projecting contact point 15'. The resist material may be removed from the side of the component upon which the circuit elements are disposed, or if desired, a further layer or film of resinous insulation material may be bonded to the component over the circuit elements. Certain of the contact points may, if desired, be formed flat on the top and level with or below the opposite surface of base 10, in the manner described in my above identified co-pending application, and punched to provide for soldered connections with resistors, condensors, thermionic tubes, impedances, transformers or other outside circuit elements.

An alternative form of contact point connection is shown in Figure 7. In this form of construction the contact point 15'' formed as part of circuit element 11' is formed so as to project through an aperture 19 in base sheet 10. The die member, however, is shaped so as to produce a reverse depression or dimple 34 in the upper surface of the contact. At the same time, an annular rim 35 projects slightly above the surface of the base to provide sliding contact with an external element.

The form of construction shown in Figure 6 is especially adaptable for use in circuits such as those of blinking, flashing and alternating color or design, electrical signs and the like where the switching action is substantially continuous and often very rapid. The alternative form of construction, on the other hand, is especially adapted for use in combination with a contact element having a slight protrusion co-operating with depression 34 in switches, rheostats and the like wherein it is desired to lock the contacting element more securely in place to insure against dislodging of the switching element. To a lesser extent this same locking effect may be obtained with the form of construction of Figure 6 by using switch contacting elements having a slight depression in their contacting surfaces for cooperation with the slight bulge of contact point 15'.

As many apparently widely differing embodiments of this invention may be made without departing from the spirit and scope thereof, it is to be understood that I do not limit myself specifically to the embodiment disclosed herein.

What I claim is:

1. The process of making an integral insulative base and conductive contacts, which comprises forming apertures in a first sheet of electrically insulating hardenable resinous material, said apertures being formed throughout the areas where contacts are desired ultimately to be exposed through said sheet, adhesively bonding to said resinous sheet a layer of electrically conductive metal, pressing said metal against the resinous sheet to force the metal through and slightly beyond the thickness of the resinous sheet throughout at least part of the areas of said apertures, applying to the exposed surfaces of said conductive metal on both sides of said sheet a stop-off material capable of resisting the eroding effect of an etching bath for said metal, said stop-off material being applied to the metallic surfaced side of said sheet over the depressed contact areas thereof and areas contiguous thereto and along other elongated areas formed circuit elements connecting at least some of said contact areas, etching away the unprotected metal and removing the stop-off material from the opposite side of said sheet.

2. The process of making an integral insulative base and conductive contacts, which method comprises the steps of forming apertures in a sheet of electrically insulating hardenable resinous material, said apertures being formed throughout areas of said sheet where contacts are desired ultimately to be exposed through said sheet for wiping action connection with an external circuit element, adhesively bonding to said sheet a layer of electrically conductive metal, pressing said resinous sheet having the metal bonded thereto to force the metal through and slightly beyond the thickness of the resinous sheet forming projecting contacts on the opposite side of said sheet, applying to the exposed surfaces of said conductive metal on both sides of said sheet a stop-off material capable of resisting the eroding effect of an etching bath for said metal, said stop-off material being applied to the metallic surfaced side of said sheet over the depressed contact areas thereof and areas contiguous thereto and along other elongated areas forming circuit elements connecting at least some of said contact areas, subjecting the thus prepared sheet to the effects of an etching bath to remove the unprotected metal and removing the stop-off material from the projecting contacts on the opposite side of the sheet.

3. The process according to claim 2 further characterized in that a depression is formed in the exposed surface of the contact projecting to the opposite side of said resinous sheet.

4. An electrical circuit component having improved contact surfaces which comprises a layer of electrically insulating thermoset resinous material, apertures through said layer throughout areas where wiping action contact is to be made, thin conductive metal in the form of circuit elements bonded to one surface of the resinous layer, said metal in the areas overlying the apertures in said layer being displaced through said apertures forming projecting contact points on the opposite surface of said layer.

5. An electrical circuit component according to claim 4 further characterized in that said projecting contacts have an anchoring flange on the opposite side of said layer around at least a portion of the periphery of the contacts.

6. An electrical circuit component according to claim 4 further characterized in that said contact points projecting on the opposite side of said layer have depressions in the surfaces thereof.

7. An electrical circuit component having improved contact surfaces for use in making switches and the like which component comprises a hardened and cured sheet of electrically insulating thermosetting resinous material forming a base, apertures through said base throughout areas where wiping action contact is to be made, thin electrically conductive sheet metal in the form of circuit elements bonded to one surface of said resinous base, said metal in the areas overlying the apertures in said base being drawn and displaced through and beyond at least some of said apertures to form projecting contact points on the opposite side of said base, at least some of said contact points being connected by said thin conductive metal circuit elements.

8. An electrical circuit component according to claim 7 further characterized in that said projecting contacts have an anchoring flange on the opposite side of said layer around at least a portion of the periphery of the contacts.

9. An electrical circuit component according to claim 7 further characterized in that said contact points projecting on the opposite side of said layer have depressions in the surfaces thereof.

References Cited in the file of this patent

UNITED STATES PATENTS

| | | |
|---|---|---|
| 1,717,940 | Schafer | June 18, 1929 |
| 2,616,994 | Luhn | Nov. 4, 1952 |
| 2,683,839 | Beck | July 13, 1954 |